(12) United States Patent
Nozaki et al.

(10) Patent No.: US 8,648,656 B2
(45) Date of Patent: Feb. 11, 2014

(54) LOW-NOISE AMPLIFIER WITH THROUGH-MODE

(71) Applicant: Panasonic Corporation, Osaka (JP)

(72) Inventors: Yusuke Nozaki, Osaka (JP); Hiroyuki Kohama, Nara (JP); Masaru Fukusen, Shiga (JP); Naoki Okamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/758,420

(22) Filed: Feb. 4, 2013

(65) Prior Publication Data

US 2013/0141168 A1 Jun. 6, 2013

Related U.S. Application Data

(63) Continuation of application No. PCT/JP2012/001635, filed on Mar. 9, 2012.

(30) Foreign Application Priority Data

Jun. 1, 2011 (JP) ................. 2011-123723

(51) Int. Cl.
*H03F 1/14* (2006.01)
*H03F 1/22* (2006.01)
*H03F 1/52* (2006.01)

(52) U.S. Cl.
USPC .............................. 330/51; 330/298; 330/311

(58) Field of Classification Search
USPC ............................................ 330/51, 298, 311
See application file for complete search history.

(56) References Cited

U.S. PATENT DOCUMENTS 6,175,274 B1 * 1/2001 Groe .............................. 330/51
6,653,904 B2 * 11/2003 Franca-Neto ................. 330/302

FOREIGN PATENT DOCUMENTS

| JP | 2001-251176 A | 9/2001 |
| JP | 2002-343874 A | 11/2002 |
| JP | 2007-158975 A | 6/2007 |

OTHER PUBLICATIONS

International Search Report issued in International Patent Application No. PCT/JP2012/001635 mailed Jun. 19, 2012.

* cited by examiner

*Primary Examiner* — Steven J Mottola
(74) *Attorney, Agent, or Firm* — McDermott Will & Emery LLP

(57) ABSTRACT

The low-noise amplifier with through mode is configured such that a source grounded transistor and a gate grounded transistor are connected in cascode, and a load impedance element and a switching transistor are serially connected between the drain of the gate grounded transistor and a power supply, and a through pass circuit is connected between an input terminal and an output terminal. The gate voltage of the gate grounded transistor is regulated by a bias circuit and the voltage of a mode control terminal is converted by a level shifter to control the gate voltage of the switching transistor, whereby, in the case of using only transistors whose terminal-to-terminal breakdown voltages are each equal to or less than the power supply voltage, it becomes feasible to prevent voltages equal to or more than the terminal-to-terminal breakdown voltages from being applied between the terminals of each transistor.

24 Claims, 16 Drawing Sheets

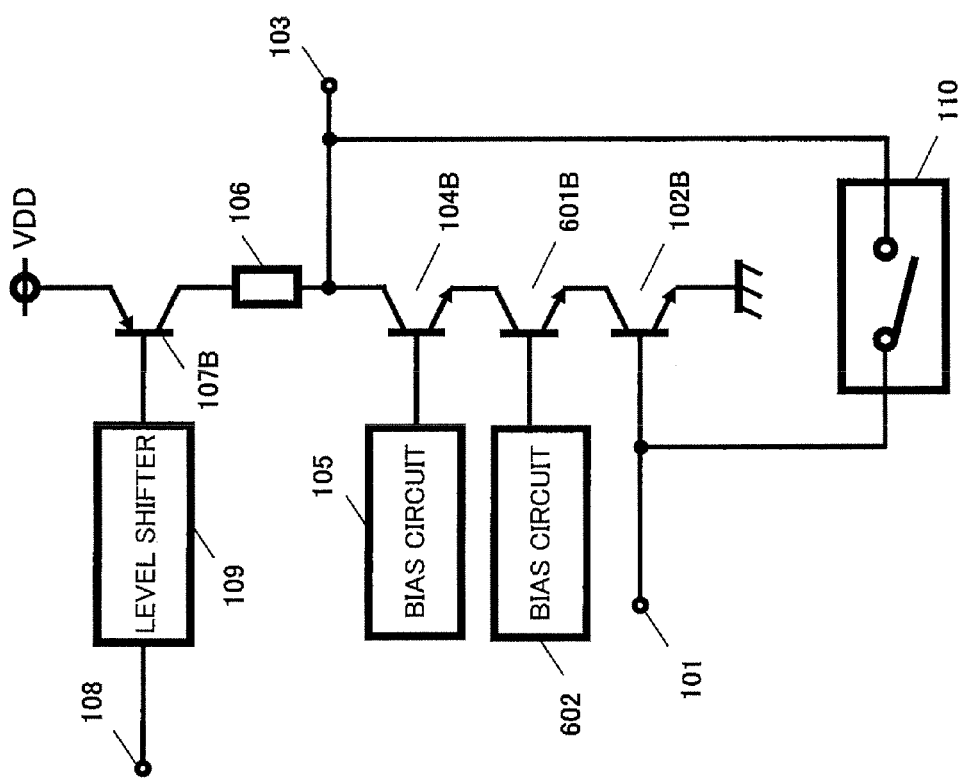

LOW-NOISE AMPLIFIER WITH THROUGH-MODE

This is a continuation application under 35 U.S.C 111(a) of pending prior International application No. PCT/JP2012/001635, filed on Mar. 9, 2012.

BACKGROUND OF THE INVENTION

1. Field of the Invention

The present invention relates to a low-noise amplifier which incorporates a through mode of operation and which is constituted by only transistors with breakdown voltages of less than the power supply voltage.

2. Background of the Art

Wireless communications equipment (for example, a cellular phone) is provided, at the first stage of its receiver, with a low-noise amplifier. In the case that the wireless communications equipment is located far away from a base station (in the case of weak signals), it is required that the low-noise amplifier should exhibit a low noise characteristic and a high gain characteristic. On the other hand, in the case that the wireless communications equipment is located in the proximity of a base station (in the case of large signals), it is required that the low-noise amplifier should exhibit a low strain characteristic and a low gain characteristic. Since, in particular in mobile communications, the strength of signal varies considerably depending on the distance between a base station and a mobile station, this requires the receiver to have a wide dynamic range. To this end, it is necessary that the low-noise amplifier in the receiving front end section should incorporate a gain control function.

As prior art Example 1 (see, for example, Japanese Laid Open Patent Application Publication No. 2007-158975), there has been known a high-frequency variable gain amplifier. This amplifier includes a first amplifier (an amplification mode of operation) for high-gain amplification of high-frequency signals inputted from outside and a second amplifier (a through mode of operation) for low-gain pass of high-frequency signals inputted from outside.

Referring to FIG. 7, a description will be given in regard to the high-frequency variable gain amplifier of the prior art Example 1.

In FIG. 7, the first amplifier (amplification mode) is a cascode amplifier which comprises a cascode connection of a transistor 51 and a transistor 50, an impedance element 6 and a load impedance element 5. In addition, the second amplifier (through mode) is a through pass amplifier which comprises a series connection of a high-frequency switch 62 and an impedance element 9. When the high-frequency variable gain amplifier is made to function as the first amplifier (amplification mode), a high-frequency switch 60 is turned on, whereas the high-frequency switch 62 is turned off. The received signal, inputted to an input terminal P10, enters the base of the transistor 51, passes through the transistor 50 and then through the impedance element 7 and then through the impedance element 8, and is outputted through an output terminal P12. The factor of amplification in this case is determined by the impedance elements 6, 5.

On the other hand, when the high-frequency variable gain amplifier is made to function as the second amplifier (through mode), the high-frequency switch 60 is turned off, whereas the high-frequency switch 62 is turned on. The received signal, inputted to the input terminal P10, enters the source side of the high-frequency switch 62, thereafter is outputted through the drain side of the high-frequency switch 62, and passes through the impedance element 9. At this time, the signal path between the load impedance element 5 and the output impedance element 7 is being placed in a state of disconnection by the high-frequency switch 60. Therefore, the high-frequency signal, after passage through the impedance element 9, passes through the impedance element 8 and is provided to the output terminal P12, without leaking in the direction of the impedance element 7.

SUMMARY OF THE INVENTION

In recent years, the lowering of power consumption, size and cost of the wireless communications equipment has been progressed, and miniaturized processing is also often employed for low-noise amplifiers. Use of the miniaturized processing provides advantages such as higher gain for transistors as a single element and reduction in noise. However, there are also provided disadvantages such as deterioration in transistor breakdown-voltage characteristic.

In order to prevent voltages equal to or more than drain-gate, gate-source and drain-source breakdown voltages (hereinafter, referred to as "terminal-to-terminal breakdown voltages") from being applied to transistors, there are separately prepared transistors with high breakdown voltage characteristics in the miniaturized processing. However, if plural types of transistors having different breakdown voltages are prepared, this will increase not only the cost in the production process but also the lead time.

When it comes to thinking of employing the prior art Example 1 in a miniaturized processing, it is contemplated that, at the time of operation in amplification mode that requires a low noise characteristic and a high gain characteristic, there is used as the transistor 51 a low breakdown-voltage transistor which is high in gain and low in noise. In addition, generally it is contemplated that, in order to place the high-frequency switch 60 in the on state, a voltage of 0 V is applied to the gate of the high-frequency switch 60. In this case, the voltage difference which is applied between the gate and the source of the high-frequency switch 60 becomes equal to the power supply voltage. This makes it impossible to employ a transistor whose terminal-to-terminal breakdown voltages are each less than the power supply voltage. Accordingly, there is used a transistor whose terminal-to-terminal breakdown voltages are each equal to or more than the power supply voltage. To sum up, for the transistor 51 and the high-frequency switch 60, plural types of transistors having different terminal-to-terminal breakdown voltages are required, therefore producing the problem that increases the cost in the production process as well as the lead time.

As a method for solving this problem, there is a technique of employing either a DC/DC converter or a regulator so as to use only transistors whose terminal-to-terminal breakdown voltages are each less than the power supply voltage. This technique will be described by making reference to FIG. 8. Note here that members that are similar to corresponding members shown in FIG. 7 are assigned the same reference numerals and their description is omitted accordingly. As shown in FIG. 8, a DC/DC converter 70 is inserted between the power supply and the load impedance element 5. By conversion of the power supply voltage into a voltage equal to or less than the terminal-to-terminal breakdown voltages of the transistors by the DC/DC converter 70, it is made possible to prevent voltages equal to or more than the terminal-to-terminal breakdown voltages from being applied between the terminals of each transistor. However, the problem associated with this technique is that, since the DC/DC converter 70 is provided in a "hanging" fashion on the load side of the first amplifier (amplification mode), this results in addition of capacitance components or the like attributable to the DC/DC converter 70 to the load side, due to which the high-frequency characteristic becomes poor. As a result, it is required to take countermeasures, such as increasing the electric current so as to secure the same high-frequency characteristic as before adoption of the DC/DC converter. This however leads to an increase in power consumption. Furthermore, the requirement for an extra DC/DC converter will increase area, therefore making it also impossible to accomplish reduction in size.

The present invention provides solutions to the problems associated with the prior art technology, and the purpose of the present invention is to provide a low-noise amplifier with through-mode capable of, while forming circuitry by use of only transistors whose terminal-to-terminal breakdown voltages are each equal to or less than the power supply voltage, preventing voltages equal to or more than the terminal-to-terminal breakdown voltages of each transistor from being applied between the terminals of each transistor.

In order to solve the foregoing problems, there is provided, according to an aspect of the present invention, a low-noise amplifier with through-mode having an amplification mode in which input signals are amplified and a through mode in which input signals are let through, the low-noise amplifier with through-mode comprising: a source grounded transistor connected at its gate to an input terminal; a gate grounded transistor connected in cascode to the source grounded transistor and connected at its drain to an output terminal; a bias circuit connected to a gate of the gate grounded transistor, a load impedance element connected to a drain of the gate grounded transistor; a switching transistor connected between the load impedance element and a power supply; a level shifter connected between a gate of the switching transistor and a mode control terminal to which a mode signal is inputted; and a through-pass circuit, connected between the input terminal and the output terminal, which, in response to the mode signal, turns off when the switching transistor turns on, and turns on when the switching transistor turns off; wherein at least one of a first breakdown voltage, a second breakdown voltage and a third breakdown voltage, which are a drain-gate breakdown voltage, a gate-source breakdown voltage and a drain-source breakdown voltage, of each of the source grounded transistor, the gate grounded transistor and the switching transistor, is equal to or less than a voltage of the power supply (hereinafter, referred to as a "power supply voltage").

With this configuration, it is made possible to compose a low-noise amplifier with through-mode which is capable of preventing voltages, which are equal to or more than the terminal-to-terminal breakdown voltages of each transistor, from being applied between the terminals of each transistor, and which is composed only of transistors whose terminal-to-terminal breakdown voltages are each less than the power supply voltage.

It may be configured such that in the amplification mode the level shifter outputs a voltage which is equal to or more than a differential between the power supply voltage and a lowest of the first, second and third breakdown voltages and equal to or less than a differential between the power supply voltage and a gate-to-source voltage that turns on the switching transistor, while in the through mode the level shifter outputs a voltage that turns off the switching transistor, and that the level shifter is constituted by a transistor at least one of whose first, second and third breakdown voltages is equal to or less than the power supply voltage. With this configuration, it is made possible to prevent voltages, which are equal to or more than the terminal-to-terminal breakdown voltages, from being applied between the terminals of the switching transistor, and it is made possible for a low-noise amplifier with through-mode to be composed only of transistors whose terminal-to-terminal breakdown voltages are each less than the power supply voltage.

It may be configured such that the bias circuit outputs a voltage which is equal to or more than a differential between the power supply voltage and a lowest of the first, second and third breakdown voltages and equal to or less than a lowest of the first, second and third breakdown voltages, and that the bias circuit is constituted by a transistor at least one of whose first, second and third breakdown voltages is equal to or less than the power supply voltage. With this configuration, it is made possible to prevent voltages, which are equal to or more than the terminal-to-terminal breakdown voltages, from being applied between the terminals of each of the source and the gate grounded transistors, and it is made possible for a low-noise amplifier with through-mode to be composed only of transistors whose terminal-to-terminal breakdown voltages are each less than the power supply voltage.

It may be configured such that in the through mode the bias circuit outputs a voltage which is equal to or less than a lowest of the first, second and third breakdown voltages, and that the bias circuit is constituted by a transistor at least one of whose first, second and third breakdown voltages is equal to or less than the power supply voltage. With this configuration, it is made possible to prevent voltages, which are equal to or more than the terminal-to-terminal breakdown voltages, from being applied between the terminals of each of the source and the gate grounded transistors, and it is made possible for a low-noise amplifier with through-mode to be composed only of transistors whose terminal-to-terminal breakdown voltages are each less than the power supply voltage.

It may be configured such that the load impedance element is a resonance circuit composed of an inductor and a capacitor wherein the inductor and the capacitor are connected in parallel with each other. With this configuration, it is made possible to produce a high gain at specific frequencies.

It may be configured such that between the drain and the source of the switching transistor there is connected a switch parallel impedance element. With this configuration, it is made possible to provide a good passing characteristic by regulation of the output impedance in the through mode.

It may be configured such that the switch parallel impedance element is a resistor. With this configuration, it is made possible to regulate the output impedance with less area by use of a resistor.

It may be configured such that between the source of the source grounded transistor and ground there is connected a source impedance element. With this configuration, it is made possible to accomplish improvement in strain characteristic because the source voltage varies in response to the input signal.

It may be configured such that the source impedance element is an inductor. With this configuration, it is made possible to reduce the input return loss by use of an inductor.

It may be configured such that the through pass circuit comprises a transistor switch which outputs a signal, inputted to its drain or source, through its source or drain and which is turned off in the amplification mode and turned on in the through mode by the mode signal to be inputted to its gate. With this configuration, it is made possible to provide a good passing characteristic in the through mode.

It may be configured such that the through pass circuit comprises a serial connection of plural stages of the transistor switches. With this configuration, it is made possible to enhance isolation of the through pass circuit in the amplification mode, and to prevent voltages equal to or more than the terminal-to-terminal breakdown voltages from being applied to each terminal of each transistor switch.

It may be configured such that the low-noise amplifier with through-mode further includes a cascode transistor composed of one or more gate grounded transistors connected in cascode between the source grounded transistor and the gate grounded transistor and a cascode bias circuit connected to the gate of each cascode transistor. With this configuration, it is made possible for a low-noise amplifier with through-mode to be composed only of transistors whose terminal-to-terminal breakdown voltages are each less than the power supply voltage even when the power supply voltage is twice or more a lowest of the terminal-to-terminal breakdown voltages of the transistors.

In addition, there is provided, according to another aspect of the present invention, a low-noise amplifier with through-mode having an amplification mode in which input signals are amplified and a through mode in which input signals are let through, the low-noise amplifier with through-mode comprising: an emitter grounded transistor connected at its base to an input terminal; a base grounded transistor connected in cascode to the emitter grounded transistor and connected at its collector to an output terminal; a bias circuit connected to a base of the base grounded transistor; a load impedance element connected to a collector of the base grounded transistor; a switching transistor connected between the load impedance element and a power supply; a level shifter connected between a base of the switching transistor and a mode control terminal to which a mode signal is inputted; and a through pass circuit, connected between the input terminal and the output terminal, which, in response to the mode signal, turns off when the switching transistor turns on, and turns on when the switching transistor turns off; wherein at least one of a first breakdown voltage, a second breakdown voltage, and a third breakdown voltage, which are a collector-to-base breakdown voltage, a base-to-emitter breakdown voltage and a collector-to-emitter breakdown voltage, of each of the emitter grounded transistor, the base grounded transistor and the switching transistors is equal to or less than a voltage of the power supply (hereinafter, referred to as a "power supply voltage").

With this configuration, it is made possible to compose a low-noise amplifier with through-mode which is capable of preventing voltages, which are equal to or more than the terminal-to-terminal breakdown voltages of each transistor, from being applied between the terminals of each transistor, and which is composed only of transistors whose terminal-to-terminal breakdown voltages are each less than the power supply voltage.

It may be configured such that in the amplification mode the level shifter outputs a voltage which is equal to or more than a differential between the power supply voltage and a lowest of the first, second and third breakdown voltages and equal to or less than a differential between the power supply voltage and a base-to-emitter voltage that turns on the switching transistor, while in the through mode the level shifter outputs a voltage that turns off the switching transistor, and that the level shifter is constituted by a transistor at least one of whose first, second and third breakdown voltages is equal to or less than the power supply voltage. With this configuration, it is made possible to prevent voltages, which are equal to or more than the terminal-to-terminal breakdown voltages, from being applied between the terminals of the switching transistor and it is made possible for a low-noise amplifier with through-mode to be composed only of transistors whose terminal-to-terminal breakdown voltages are each less than the power supply voltage.

It may be configured such that the bias circuit outputs a voltage equal to or more than a differential between the power supply voltage and a lowest of the first, second and third breakdown voltages and equal to or less than a lowest of the first, second and third breakdown voltages, and that the bias circuit is constituted by a transistor at least one of whose first, second and third breakdown voltages is equal to or less than the power supply voltage. With this configuration, it is made possible to prevent voltages, which are equal to or more than the terminal-to-terminal breakdown voltages, from being applied between the terminals of each of the source and the gate grounded transistors, and it is made possible for a low-noise amplifier with through-mode to be composed only of transistors whose terminal-to-terminal breakdown voltages are each less than the power supply voltage.

It may be configured such that in the through mode the bias circuit outputs a voltage which is equal to or less than a lowest of the first, second and third breakdown voltages, and that the bias circuit is constituted by a transistor at least one of whose first, second and third breakdown voltages is equal to or less than the power supply voltage. With this configuration, it is made possible to prevent voltages, which are equal to or more than the terminal-to-terminal breakdown voltages, from being applied between the terminals of each of the source and the gate grounded transistors, and it is made possible for a low-noise amplifier with through-mode to be composed only of transistors whose terminal-to-terminal breakdown voltages are each less than the power supply voltage.

It may be configured such that the load impedance element is a resonance circuit composed of an inductor and a capacitor wherein the inductor and the capacitor are connected in parallel with each other. With this configuration, it is made possible to produce a high gain at specific frequencies.

It may be configured such that between the collector and the emitter of the switching transistor there is connected a switch parallel impedance element. With this configuration, it is made possible to provide a good passing characteristic by regulation of the output impedance in the through mode.

It may be configured such that the switch parallel impedance element is a resistor. With this configuration, it is made possible to regulate the output impedance with less area by use of a resistor.

It may be configured such that between the emitter of the emitter grounded transistor and ground there is connected an emitter impedance element. With this configuration, it is made possible to accomplish improvement in strain characteristic because the source voltage varies in response to the input signal.

It may be configured such that the emitter impedance element is an inductor. With this configuration, it is made possible to reduce the input return loss by use of an inductor.

It may be configured such that the through pass circuit comprises a transistor switch which outputs a signal, inputted to its collector or emitter, through its emitter or collector and which is turned off in the amplification mode and turned on in the through mode by the mode signal to be inputted at its base. With this configuration, it is made possible to provide a good passing characteristic in the through mode.

It may be configured such that the through pass circuit comprises a serial connection of plural stages of the transistor switches. With this configuration, it is made possible to enhance isolation of the through pass circuit in the amplification mode, and to prevent voltages equal to or more than the terminal-to-terminal breakdown voltages from being applied to each terminal of each of the transistor switches.

It may be configured such that the low-noise amplifier with through-mode further includes a cascode transistor composed of one or more base grounded transistors connected in cascode between the emitter grounded transistor and the base grounded transistor and a cascode bias circuit connected to the base of each cascode transistor. With this configuration, it is made possible for a low-noise amplifier with through-mode to be composed only of transistors whose terminal-to-terminal breakdown voltages are each less than the power supply voltage even when the power supply voltage is twice or more the lowest of the terminal-to-terminal breakdown voltages of the transistors.

As has been described above, by the present invention, it is made possible to implement, by use of only transistors whose terminal-to-terminal breakdown voltages are each less than the power supply voltage, a low-noise amplifier with through-mode capable of preventing voltages, which are equal to or more than the terminal-to-terminal breakdown voltages, from being applied between the terminals of each of the transistors.

These objects as well as other objects, features and advantages of the present invention will become apparent to those skilled in the art from the following detailed description of preferred embodiments with reference to the accompanying drawings.

BRIEF DESCRIPTION OF THE DRAWINGS

FIG. 14 is a circuit diagram showing an example of a low-noise amplifier with through-mode according to the fourth embodiment of the present invention.

DETAILED DESCRIPTION OF THE PREFERRED EMBODIMENTS

Hereinafter, the mode of embodiments of the present invention will be described more specifically with reference to the drawings.

Embodiment 1

Figure 1:
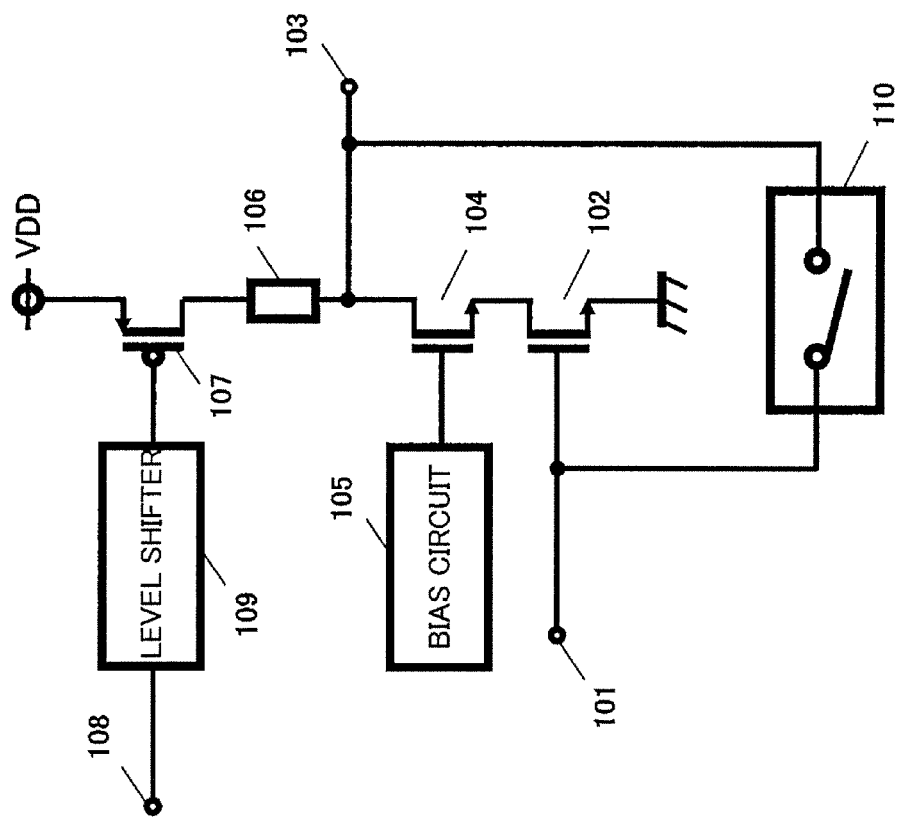
FIG. 1 is a circuit diagram showing an example of a low-noise amplifier with through-mode according to a first embodiment of the present invention.

FIG. 1 is a diagram illustrating a configuration of a low-noise amplifier with a through mode of operation for explaining the mode of an embodiment of the present invention.

(Configuration)

Transistors are made use of in a low-noise amplifier with through-mode configured according to a first embodiment of the present invention. As such "transistors", either field-effect transistors or bipolar transistors may be employed. In the present first embodiment as well as in the following second and the third embodiments, there is shown by way of example a configuration that makes use of MOSFETs as field-effect transistors. Needless to say, MISFETs, MESFETs or other like field-effect transistors may be used as a field-effect transistor. In addition, in the following example, it may be configured such that n-channel MOSFETs and p-channel MOSFETs are replaced with each other. Additionally, in the specification and the claims of the application, it is understood that each "terminal-to-terminal" of a transistor is conveniently represented by a combination of one terminal name and the other connected by hyphen, for example, a "gate-to-source".

Referring to FIG. 1, a source grounded transistor 102 which is connected to an input terminal 101 at its gate and is connected to ground at its source functions as a first-stage amplifier in the amplification mode. A gate grounded transistor 104, which is connected in cascode to the source grounded transistor 102 and is connected to an output terminal 103 at its drain, functions as a second-stage amplifier in the amplification mode. A bias circuit 105 determines a gate voltage of the gate grounded transistor 104. A load impedance element 106 is connected to the drain of the gate grounded transistor 104. A switching transistor 107 is connected between the load impedance element 106 and a power supply VDD. A level shifter 109 which is connected between a mode control terminal 108 and the gate of the switching transistor 107 switches the gate voltage of the switching transistor 107 in response to a mode signal (i.e., a signal indicative of either an amplification mode or a through mode) inputted at the control terminal 108. Connected between the input terminal 101 and the output terminal 103 is a through pass circuit 110 through which input signals are let through in the through mode.

Here, what is meant by the term "source grounded transistor" is a transistor which constitutes a so-called source grounded circuit. The source of such a transistor may be connected either directly or through an impedance element including a resistive component to ground. In addition, what is meant by the term "gate ground transistor" is a transistor which constitutes a so-called gate grounded circuit. The gate of such a transistor may be connected either directly or through an impedance element including a resistive component to ground.

Each of the transistors making up the low-noise amplifier with through-mode shown in FIG. 1 is a transistor whose terminal-to-terminal breakdown voltages are each less than the power supply voltage (for example, 3.3 V), e.g., a transistor with terminal-to-terminal breakdown voltages of 2.8 volts.

Figure 2:
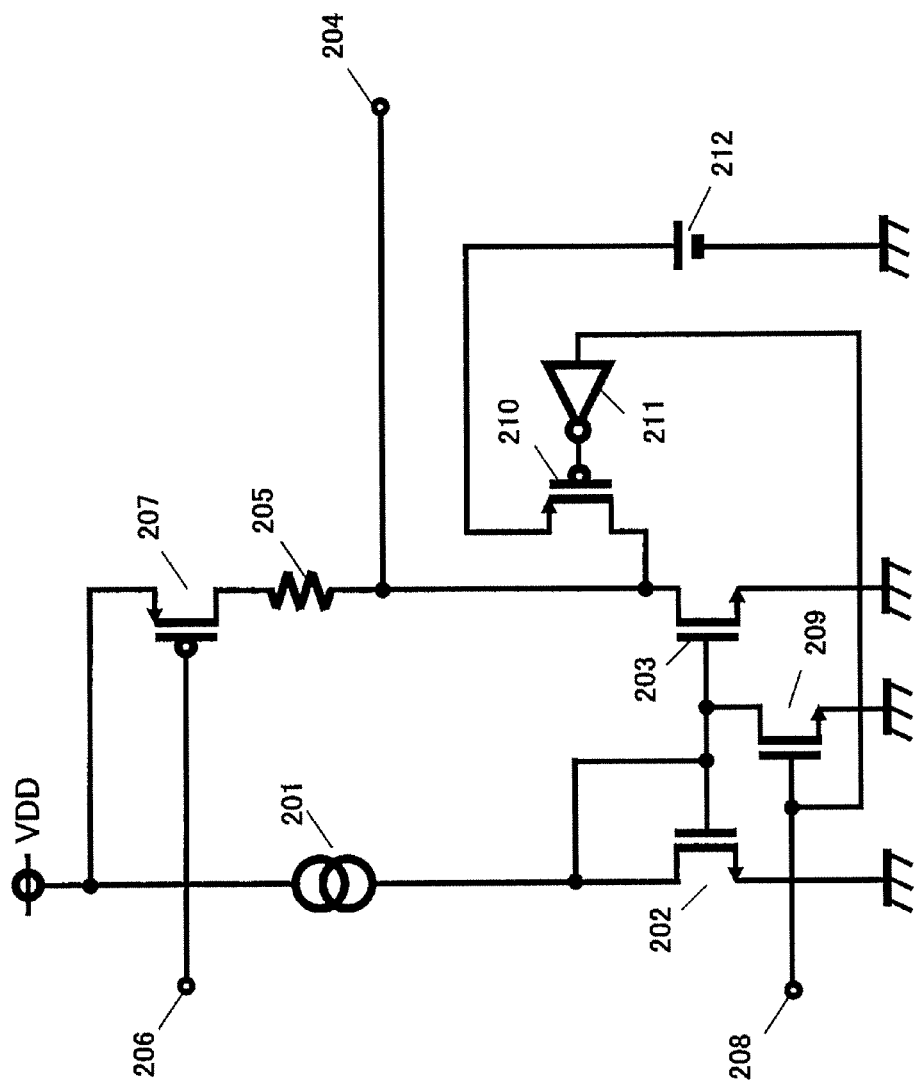
FIG. 2 is a circuit diagram showing an example of a bias circuit in the low-noise amplifier with through-mode according to the first embodiment of the present invention.

FIG. 2 shows by way of example circuitry of the bias circuit 105.

As shown in FIG. 2, the bias circuit 105 comprises: a primary side transistor 202 and a secondary side transistor 203 which together form a current mirror circuit for replicating or mirroring an electric current from an electric current source 201; a resistor 205 for determining the voltage of an output terminal 204 from a mirrored electric current; a switching transistor 207 which is connected between the power supply VDD and the resistor 205 and which is connected to a control terminal 206 at its gate; a switching transistor 209 which is connected between the gate of the primary side transistor 202 of the mirror circuit and ground, which is connected between the gate of the secondary side transistor 203 of the mirror circuit and ground and which is connected to a control terminal 208 at its gate; a switching transistor 210 which is connected between the output terminal 204 and a bias power supply source 212; and an inverter 211 which is connected between the gate of the switching transistor 210 and the control terminal 208.

Figure 3:
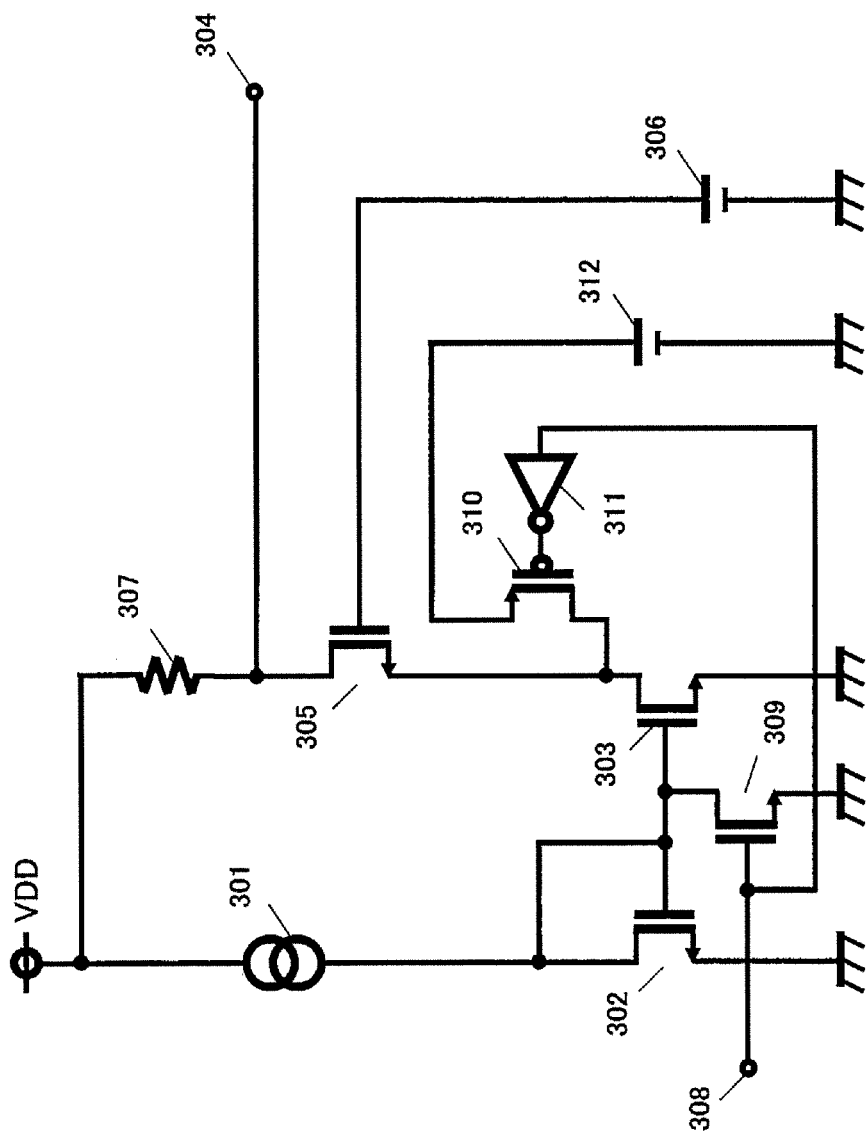
FIG. 3 is a circuit diagram showing an example of a level shifter in the low-noise amplifier with through-mode according to the first embodiment of the present invention.

FIG. 3 shows by way of example circuitry of the level shifter 109.

As shown in FIG. 3, the level shifter 109 comprises: an electric current source 301; a current mirror circuit, made up of a primary side transistor 302 and a secondary side transistor 303, for replicating or mirroring an electric current from an electric current source 301; a gate grounded transistor 305 which is connected between the drain of the secondary side transistor 303 and an output terminal 304 and which is connected to a bias power supply source 306 at its gate; a resistor 307 which is connected between the gate grounded transistor 305 and a power supply source VDD; a switching transistor 309 which is connected between the gate of the primary side transistor 302 and ground, which is connected between the gate of the secondary side transistor 303 and ground and which is connected to a control terminal 308 at its gate; a switching transistor 310 which is connected between the drain of the secondary side transistor 303 and a bias power supply source 312; and an inverter 311 which is connected between the gate of the switching transistor 310 and the control terminal 308.

Figure 4A:
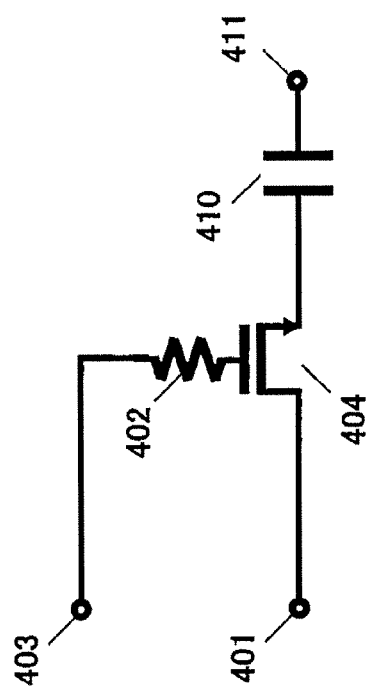
FIG. 4A is a circuit diagram showing an example of a through pass circuit in the low-noise amplifier with through-mode according to the first embodiment of the present invention.
Figure 4B:
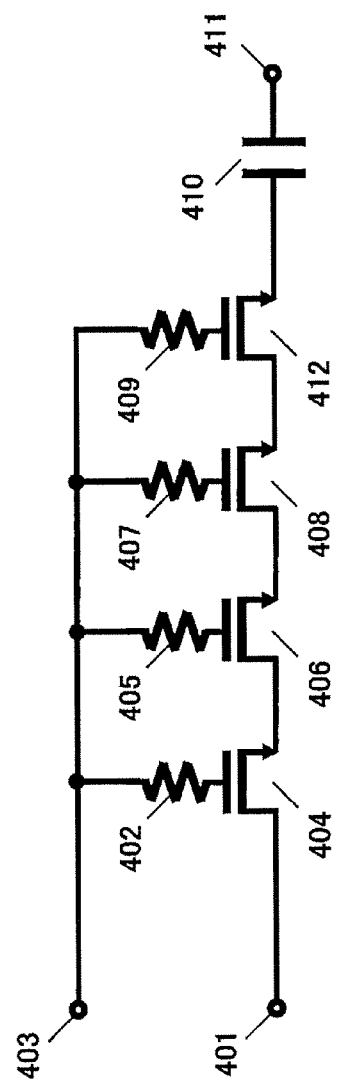
FIG. 4B is a circuit diagram showing another example of through pass circuit in the low-noise amplifier with through-mode according to the first embodiment of the present invention.

Referring now to FIGS. 4A and 4B, there is shown by way of example circuitry of the through pass circuit 110.

As shown in FIG. 4A, here, the through pass circuit 110 is constituted by a transistor switch 404 which is connected to an input terminal 401 at its drain or source, which is connected through a resistor 402 to a control terminal 403 at its gate and which is connected through a capacitor 410 to an output terminal 411 at its source or drain. The one as shown in FIG. 4A comprises a single stage of a transistor (i.e., the transistor switch 404) that serves as a switch.

FIG. 4B shows by way of example circuitry comprising four stages of transistors each serving as a switch. Referring to FIG. 4B, here, the through pass circuit 110 comprises: a transistor switch 404 which is connected to an input terminal 401 at its drain or source and which is connected through a resistor 402 to a control terminal 403 at its gate; a transistor switch 406 which is connected to the source or drain of the transistor switch 404 at its drain or source and which is connected through a resistor 405 to the control terminal 403 at its gate; a transistor switch 408, the drain or source of which is connected to the source or drain of the transistor switch 406 at its drain or source and which is connected through a resistor 407 to the control terminal 403 at its gate; and a transistor switch 412 which is connected to the source or drain of the transistor switch 408 at its drain or source, which is connected through a resistor 409 to the control terminal 403 at its gate and which is connected through a capacitor 410 to an output terminal 411 at its source or drain.

For the case of the configuration exemplarily shown in FIG. 4A, the number of transistor switches through which signals will pass is one. According to this configuration, the passing loss during passage of signals is small, but the isolation characteristic during blocking of signals becomes worse. In addition, if a large signal is inputted, all the input signal amplitude acts on the terminal of the transistor switch 404 on the side of the input terminal 401. Therefore, it is impossible to input a large signal equal to or more than the terminal-to-terminal breakdown voltage. In accordance with the configuration exemplarity shown in FIG. 4B, there are connected four transistor switches. Therefore, the isolation characteristic is good during blocking of signals, although the passing loss during passage of signals increases. In addition, the input signal amplitude is scattered into each transistor, whereby it is feasible to input a large signal equal to or more than the terminal-to-terminal breakdown voltage. The present embodiment, since it makes use of transistors having a low terminal-to-terminal breakdown voltage, employs a configuration of four stages capable of inputting a large signal equal to or more than the terminal-to-terminal breakdown voltage as shown in FIG. 4B. However, it should be understood that any number of stages of transistor switches may be employed.

(Operation)

The low-noise amplifier with through-mode of the present embodiment has two operation modes, namely an amplification mode and a through mode. In the amplification mode, signals are amplified by the cascode amplifying circuit (101-109) whereas, in the through mode, signals are let through by the through pass circuit 110 as they are inputted. In the first place, a description will be given regarding the operation in the amplification mode.

In the low-noise amplifier with through-mode as shown in FIG. 1, in the amplification mode a control signal (for example, 0 volts) serving as a mode signal is inputted to the control terminal 403 of the through pass circuit 110 so that the transistor switches 404, 406, 408, 412 turn off, and the through pass circuit 110 is placed in the off state. In addition, the source grounded transistor 102 is supplied at its gate with a DC bias (for example, 0.6 volts) and an AC signal. The gate grounded transistor 104 is supplied with a bias voltage from the bias circuit 105 and operates as a gate grounded transistor. Upon input of a high-frequency signal as an AC signal to the input terminal 101, the input signal is then fed to the gate of the source grounded transistor 102, amplified by a cascode amplifying circuit comprising the source grounded transistor 102, the gate grounded transistor 104 and the load impedance element 106 and then outputted through the output terminal 103. The present embodiment employs, as the load impedance element 106, a resonance circuit comprising a parallel connection of an inductor and a capacitor, whereby it is made possible to achieve a high gain at specific frequencies. Additionally, in the present embodiment, the load impedance element 106 is in the form of a parallel circuit composed of an inductor and a capacitor. However, as a substitute for a parallel circuit of an inductor and a capacitor, it is possible to use a parallel circuit made up of an inductor and a resistor.

In the bias circuit shown in FIG. 2, a control signal (for example, 1.2 volts) that turns on the switching transistor 207 is inputted at the control terminal 206 in the amplification mode. It is set that such a control signal has a value not in excess of the terminal-to-terminal breakdown voltage of the switching transistor 207. In addition, inputted at the control terminal 208 is a control signal (for example, 0 volts) that turns off the switching transistor 209 and turns off the switching transistor 210 via the inverter 211. This allows the current mirror circuit to mirror a signal from the electric current source 201, and the mirrored current flows through the resistor 205 to thereby cause an output voltage (power supply voltage−mirrored current×resistance value in the resistor 205) to be outputted through the output terminal 204. This output voltage is required to fall within a predetermined range in order to prevent voltages equal to or more than the terminal-to-terminal breakdown voltage from being applied between the terminals of each of the gate grounded transistor 104 and the source grounded transistor 102 since it is fed to the gate of the gate grounded transistor 104. By the "predetermined range" referred to here is meant a range within which the source voltage Vs2 of the gate grounded transistor 104 is: $(VDD-Vamr) \leq Vs2 \leq Vamr$, where VDD represents the power supply voltage, Vamr the lowest of the terminal-to-terminal breakdown voltages of the transistors and Vgs2 the gate-to-source voltage of the gate grounded transistor 104. Therefore, the range, within which the gate voltage of the gate grounded transistor 104 (i.e., the output voltage Vcas of the bias circuit) should fall is: $(VDD-Vamr+Vgs2) \leq Vcas \leq (Vamr+Vgs2)$. However, in addition to this condition, for the case of the circuitry exemplarily shown in FIG. 2, it has to consider to prevent voltages equal to or more than the terminal-to-terminal breakdown voltages from being applied between the terminals of the secondary side transistor 203 of the current mirror circuit. Therefore, the range of Vcas is: $(VDD-Vamr+Vgs2) \leq Vcas \leq Vamr$. By determining the output (for example, 2.2 volts) of the bias circuit so as to meet such a condition, it becomes possible to prevent voltages equal to or more than the terminal-to-terminal breakdown voltages from being applied between the terminals of each of the source and gate grounded transistors 102, 104.

In the level shifter shown in FIG. 3, in the amplification mode a control signal (for example, 0 volts) serving as a mode signal is inputted at the control terminal 308 so that the switching transistor 309 turns off while the switching transistor 310 turns off via the inverter 311. This allows the current mirror circuit to mirror a signal from the electric current source 301. Since the bias power source 306 applies to the gate of the switching transistor 305 a voltage (for example, 1.6 volts) that turns on the switching transistor 305, the mirrored current flows through the resistor 307, whereby the output terminal 304 outputs an output voltage (power supply voltage−mirrored current×resistance value in the resistor 307). This output voltage is required to fall within a predetermined range in order to prevent voltages equal to or more than the terminal-to-terminal breakdown voltages from being applied between the terminals of the switching transistor 107 since it is fed to the gate of the switching transistor 107. By the "predetermined range" referred to here is meant a range within which each terminal-to-terminal voltage is not equal to or more than the terminal-to-terminal breakdown voltage while the switching transistor 107 is placed in the "on" state. The range within which the output voltage Vgl of the level shifter has to fall is: $(VDD-Vamr) \leq Vls \leq (VDD-Vgson)$, where Vgson represents the absolute value of the least gate-to-source voltage difference that turns on the switching transistor 107. By applying a voltage (for example, 1.2 volts) to the gate of the switching transistor 107 so as to meet this condition, it becomes possible to prevent voltages equal to or more than the terminal-to-terminal breakdown voltages from being applied between the terminals of the switching transistor 107.

Next, a description will be given in regard to the operation in the through mode.

In the low-noise amplifier with through-mode as shown in FIG. 1, in the through mode a control signal (for example, 2.5 volts) is inputted as a mode signal to the control terminal 403 of the through pass circuit 110 so that the transistor switches 404, 406, 408, 421 turn on, and the through pass circuit 110 is placed in the "on" state. In addition, the gate of the source grounded transistor 102 of the cascode amplification circuit is placed in the "off" state because the DC voltage is made to fall down to ground. Upon input of a high-frequency signal to the input terminal 101, the input signal is let to pass through the through pass circuit 110 and is outputted as it is through the output terminal 103.

In the bias circuit shown in FIG. 2, in the through mode a control signal (for example, 3.3 volts) is inputted at the control terminal 206 so that the switching transistor 207 turns off. In addition, inputted at the control terminal 208 is a control signal (for example, 2.5 volts) that turns on the switching transistor 209 and turns on the switching transistor 210 via the inverter 211. As a result, the output terminal 204 is given a voltage from the bias power supply source 212. At this time, the output-voltage range of the bias circuit has to fall within a predetermined range so as to prevent voltages equal to or more than the terminal-to-terminal breakdown voltages from being applied between each terminal. By the "predetermined range" referred to here is meant a range within which the gate voltage of the gate grounded transistor 104 (i.e., the output voltage Vcas of the bias circuit) is: $Vcas \leq Vamr$, where Vamr represents the lowest of the terminal-to-terminal breakdown voltages of the transistors. Accordingly, the voltage of the bias power supply source 212 has to fall within such a range (for example, 2.2 volts). And at this moment, the gate voltage of each of the primary and secondary side transistors of the current mirror circuit is being at ground potential, as a result of which the current mirror circuit is placed in the "off" state and no current will be outputted from the bias power supply source 212 towards the current mirror circuit.

In the level shifter shown in FIG. 3, in the through mode a control signal (for example, 2.5 volts) serving as a mode signal is inputted at the control terminal 308 so that the switching transistor 309 turns on while the switching transistor 310 turns on via the inverter 311. Along with this, the gate grounded transistor 305 is given at its source a voltage (for example, 2.5 volts) from the bias power supply source 312 so that its gate-to-source voltage becomes equal to or less than a threshold value, and then is placed in the "off" state. Therefore, the control output terminal 304 outputs a power-supply source voltage VDD of, for example, 3.3 volts. And at this moment, the gate voltage of each of the primary and secondary side transistors of the current mirror circuit is being at ground potential, as a result of which the current mirror circuit is placed in the "off" state and no current will be outputted from the bias power supply source 312 towards the current mirror circuit.

In addition, the bias circuit of FIG. 2 and the circuit shown in the level shifter of FIG. 3 are examples. That is, any other circuit may be used as long as it is a circuit which is composed only of transistors whose terminal-to-terminal breakdown voltages are each equal to or less than the power supply voltage and which is capable of outputting a desired voltage upon receipt of a control signal falling within such a range that no voltage in excess of the transistor terminal-to-terminal breakdown voltages is applied.

As can be obviously seen from the above, in accordance with the first embodiment, the voltage of the mode control terminal 108 is converted by the level shifter and the gate voltage of the gate grounded transistor 104 is regulated by the bias circuit 105, whereby, even in the case where the circuitry is composed only of transistors whose terminal-to-terminal breakdown voltages are each equal to or less than power-supply voltage, it is made possible to prevent voltages equal to or more than the terminal-to-terminal breakdown voltages from being applied between each terminal. As a result, since only transistors whose terminal-to-terminal breakdown voltages are each equal to or less than power-supply voltage are used, this allows for less cost in the production process and less lead time.

Embodiment 2

With reference to the drawings, a concrete description will be given in regard to a circuit capable of accomplishing much better high-frequency characteristics as compared to the first embodiment. Note here that corresponding members to the members described with reference to FIG. 1 are assigned the same reference numerals and their description is omitted accordingly.

Figure 5:
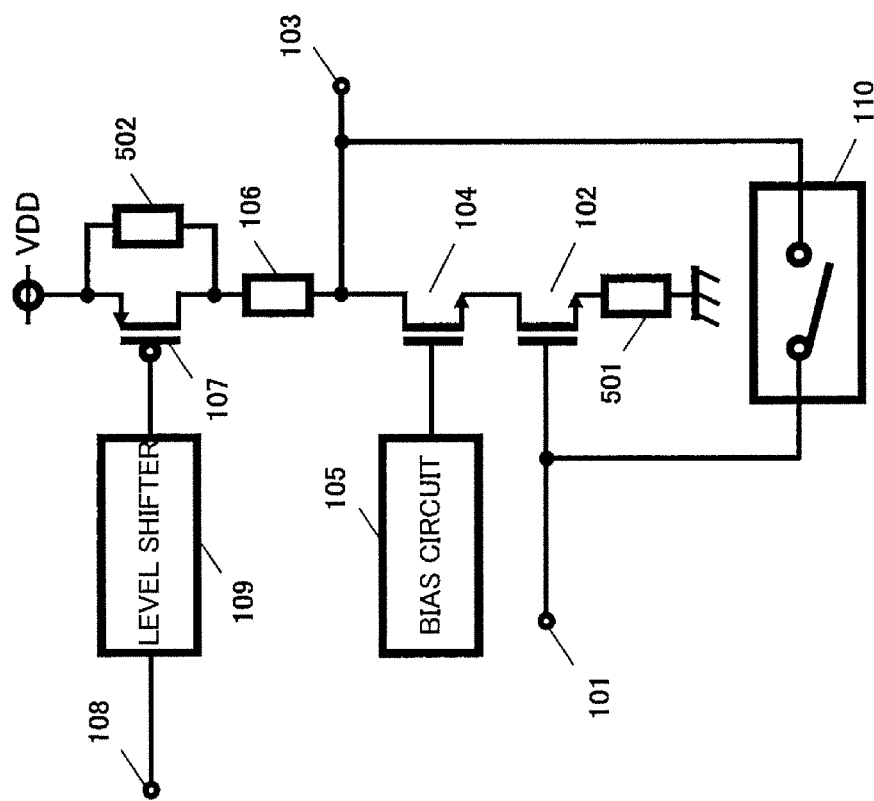
FIG. 5 is a circuit diagram showing an example of a low-noise amplifier with through-mode according to a second embodiment of the present invention.

FIG. 5 is a circuit diagram showing a configuration of a low-noise amplifier with through-mode according to the present embodiment. When compared to the configuration of FIG. 1 explained in the first embodiment, the configuration of FIG. 5 includes a source impedance element 501 which is inserted between the source of the source grounded transistor 102 and ground. In addition, connected in parallel between the drain and source of the switching transistor 107 is a switch parallel impedance element 502.

By insertion of the source impedance element 501 between the source of the source grounded transistor 102 and ground, the source voltage of the source grounded transistor 102 becomes varied, whereby there is improvement in strain characteristic.

In addition, by parallel connection of the switch parallel impedance element 502 between the drain and source of the switching transistor 107, it becomes possible to regulate the input/output return loss in the through mode, and thus it becomes possible to obtain good passing characteristics.

The present embodiment employs as the source impedance element 501 an inductor, thereby making it possible to not only provide strain improving effects but also improve the input return loss.

In addition, by using a resistor as the switch parallel impedance element 502, it becomes possible to regulate the output impedance with relatively less area and there is improvement in input/output return loss in the through mode.

In addition, although the present embodiment employs as the source impedance element 501 an inductor, there may be used as a substitute for an inductor a resistor.

In addition, although as the switch parallel impedance element 502, a resistor is used, there may be used as a substitute for a resistor either an inductor or a capacitor.

Embodiment 3

Figure 6:
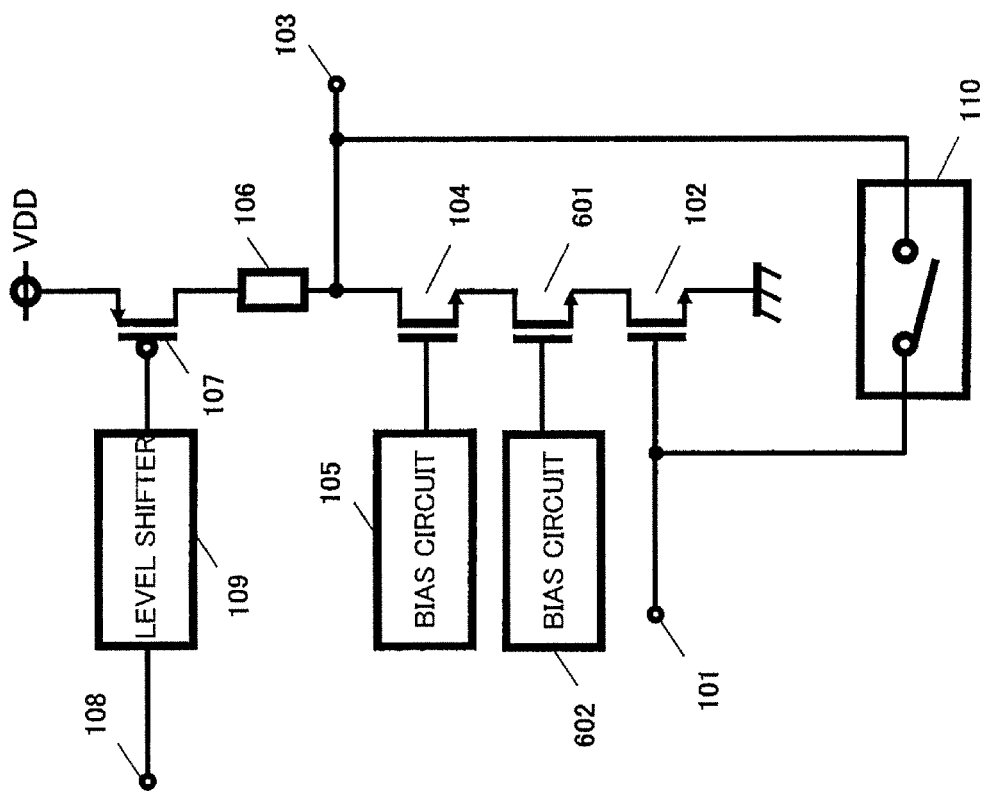
FIG. 6 is a circuit diagram showing an example of a low-noise amplifier with through-mode according to a third embodiment of the present invention.
Figure 7:
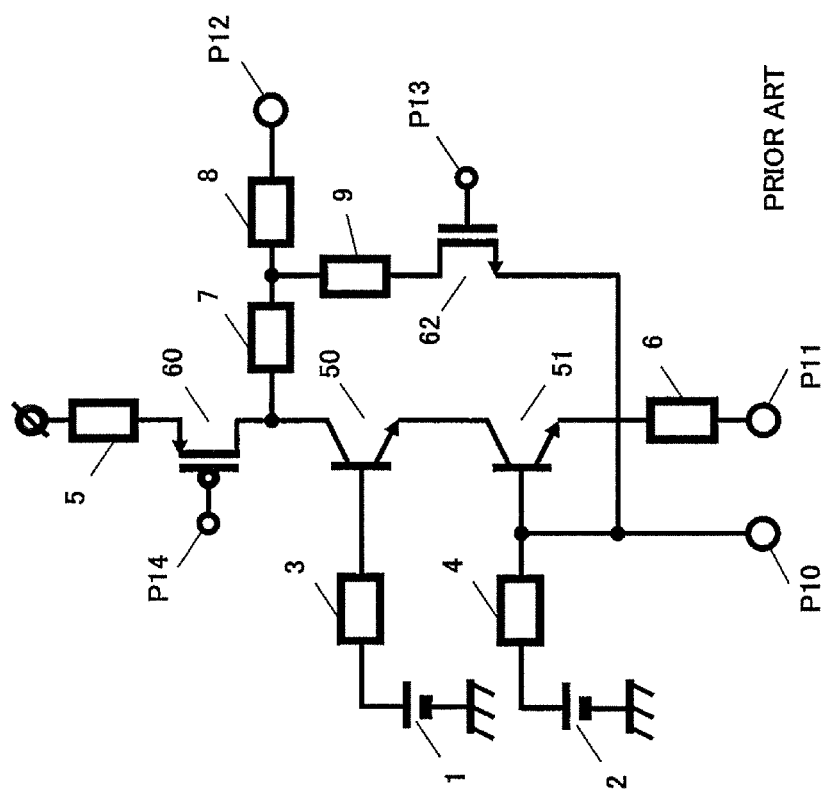
FIG. 7 is a circuit diagram showing a configuration of a conventional low-noise amplifier with through-mode.
Figure 8:
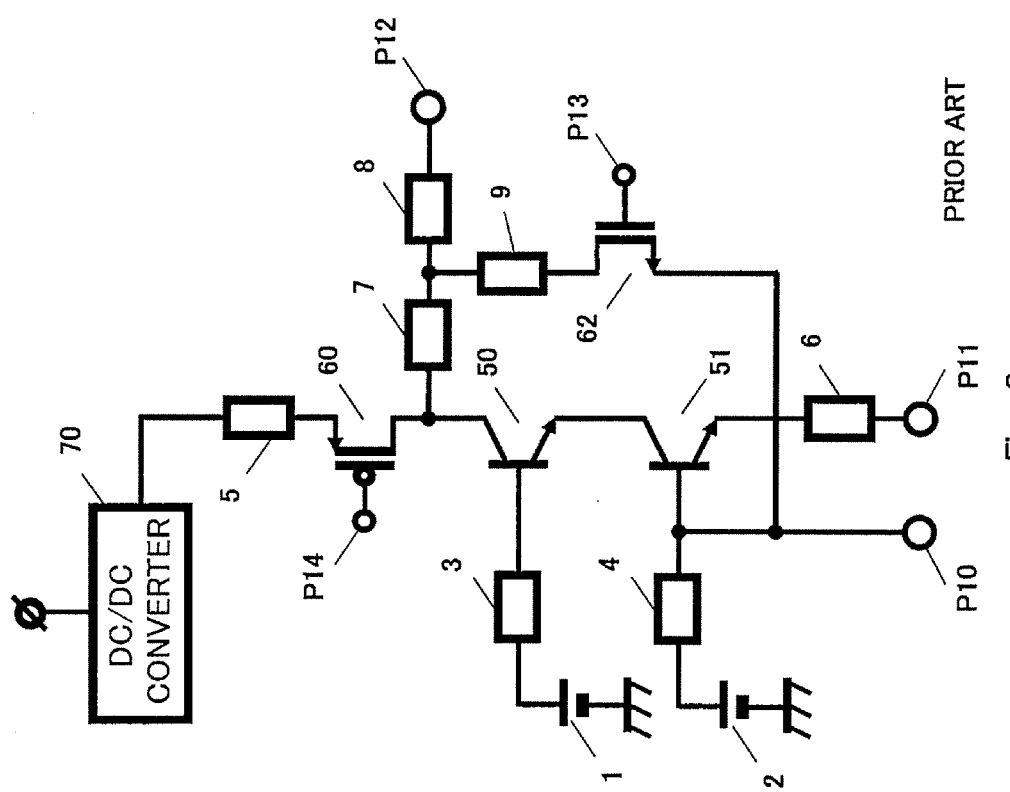
FIG. 8 is a circuit diagram showing a configuration of a low-noise amplifier with through-mode provided with an additional DC/DC converter.
Figure 9:
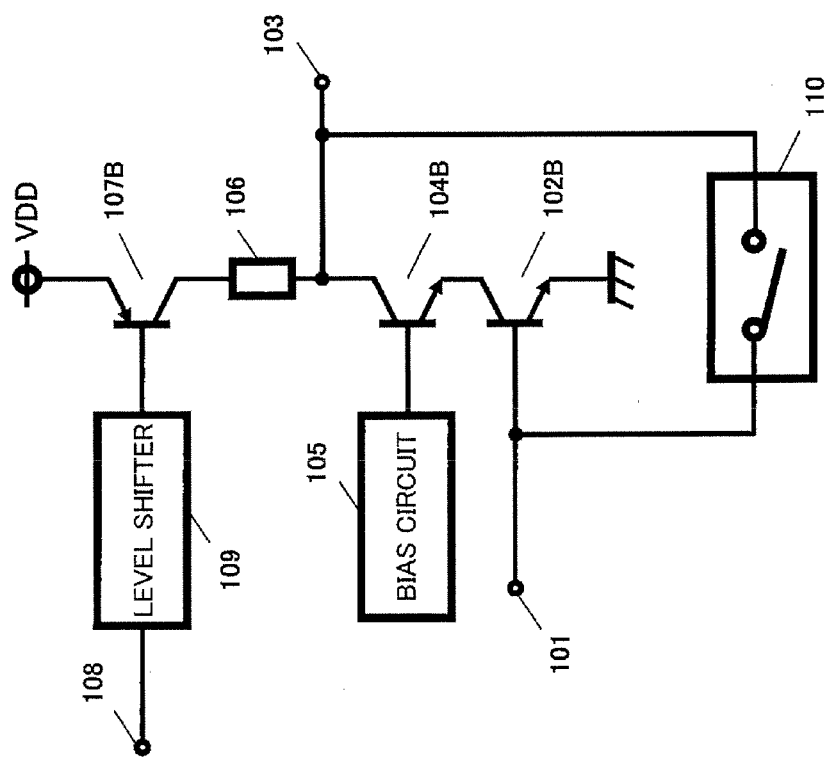
FIG. 9 is a circuit diagram showing an example of a low-noise amplifier with through-mode according to a fourth embodiment of the present invention.
Figure 10:
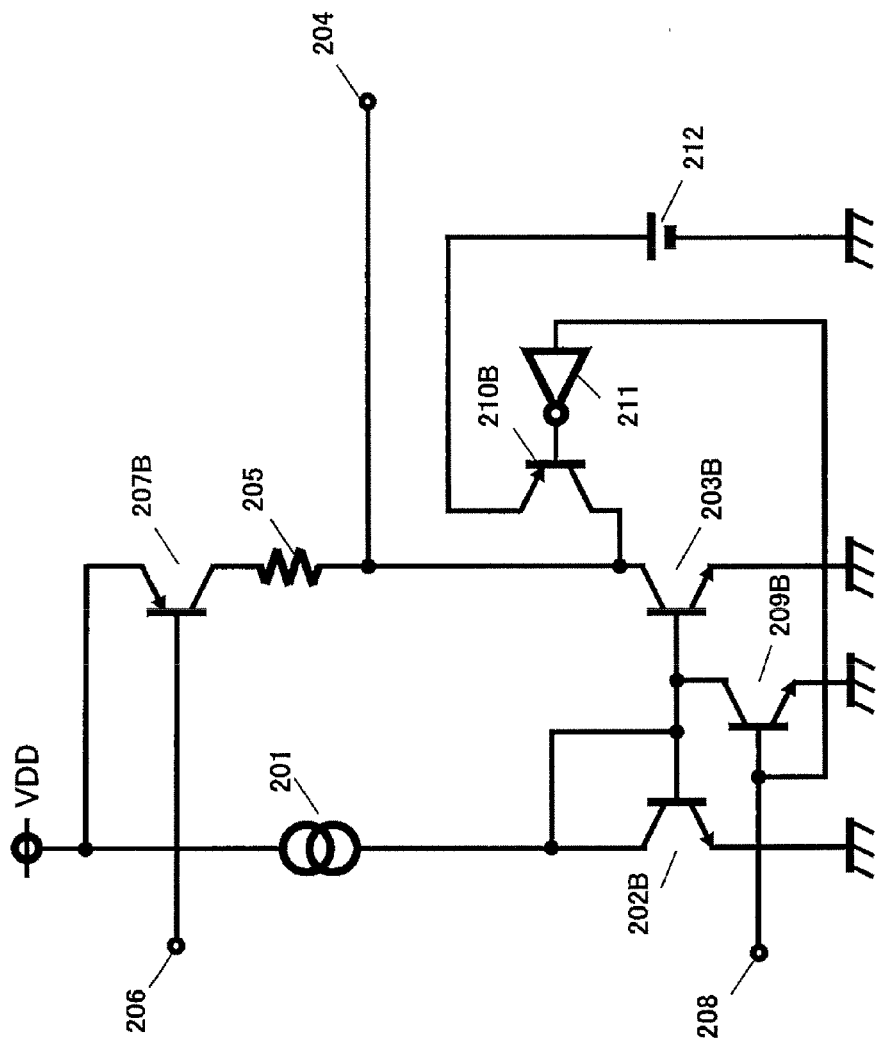
FIG. 10 is a circuit diagram showing an example of a bias circuit in the low-noise amplifier with through-mode according to the fourth embodiment of the present invention.
Figure 11:
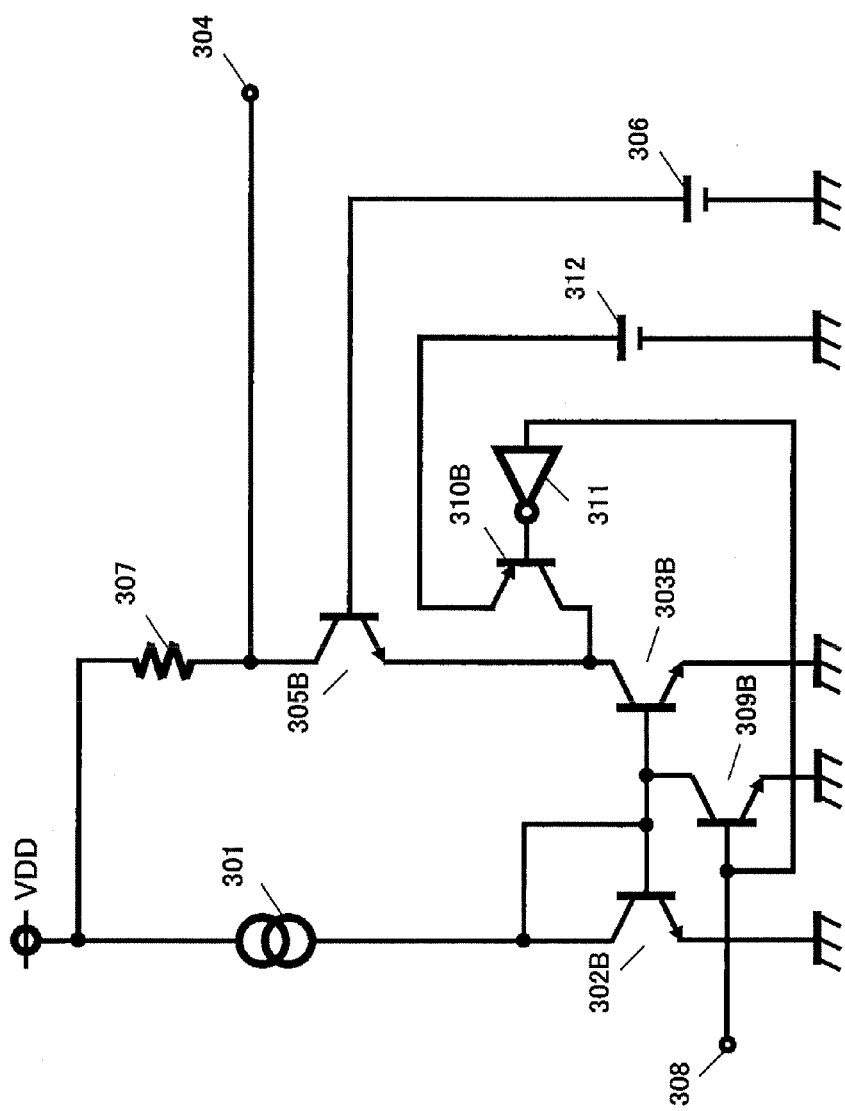
FIG. 11 is a circuit diagram showing an example of a level shifter in the low-noise amplifier with through-mode according to the fourth embodiment of the present invention.
Figure 12A:
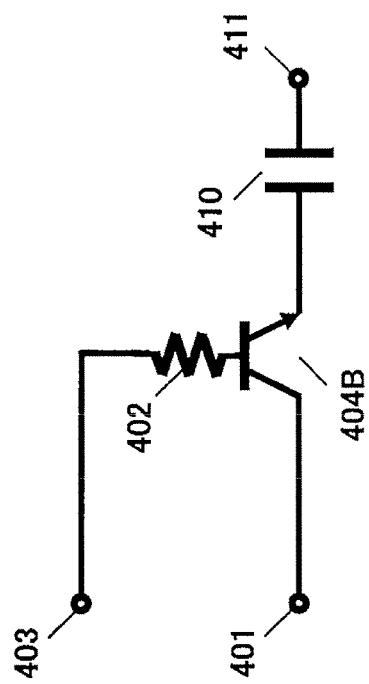
FIG. 12A is a circuit diagram showing an example of a through pass circuit in the low-noise amplifier with through-mode according to the fourth embodiment of the present invention.
Figure 12B:
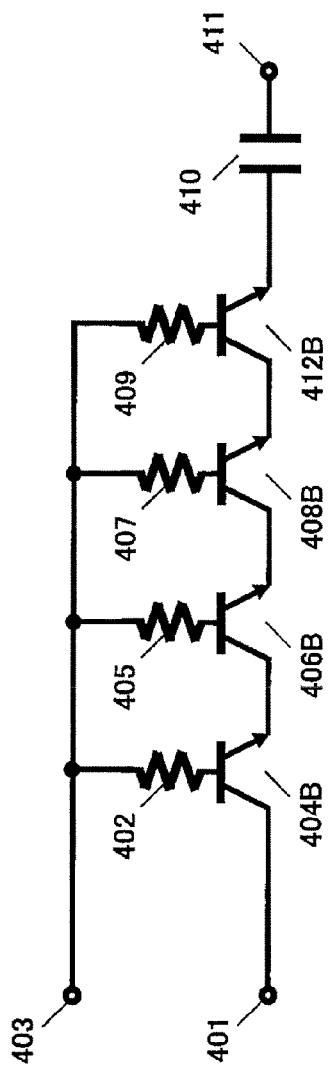
FIG. 12B is a circuit diagram showing another example of through pass circuit in the low-noise amplifier with through-mode according to the fourth embodiment of the present invention.
Figure 13:
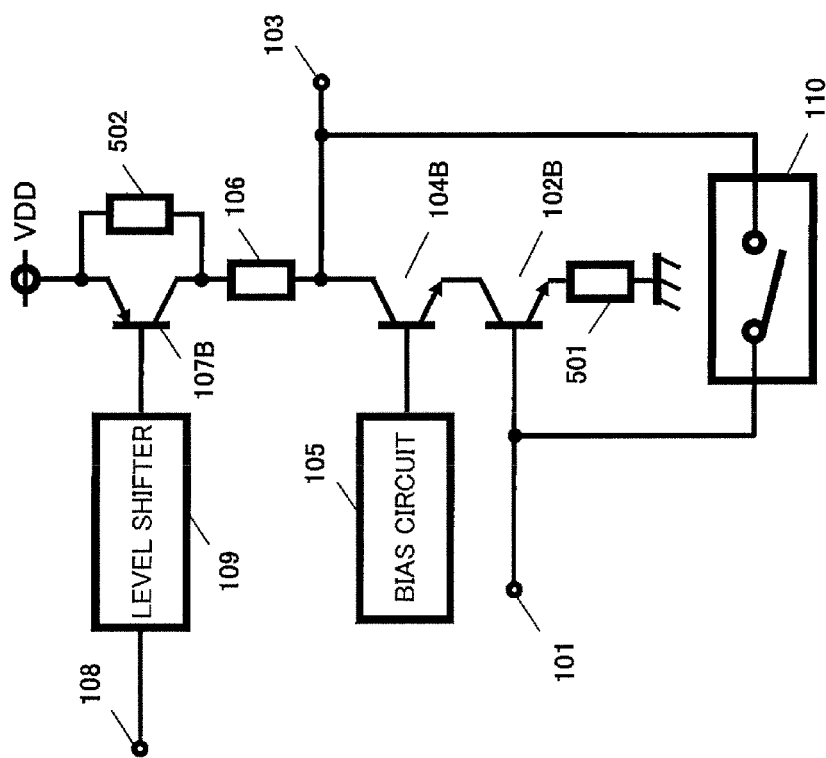
FIG. 13 is a circuit diagram showing an example of a low-noise amplifier with through-mode according to the fourth embodiment of the present invention.

A low-noise amplifier with through-mode according to the present embodiment proves effective when the power supply voltage is twice or more the terminal-to-terminal breakdown voltage between the terminals of each transistor. Referring to FIG. 6, there is shown circuitry according to the present embodiment. Note here that corresponding members to the members described with reference to FIG. 1 are assigned the same reference numerals and their description is omitted accordingly.

In FIG. 6, a cascode transistor 601 is further connected between the source grounded transistor 102 and the gate grounded transistor 104, and the gate voltage is regulated by a cascode bias circuit 602 so as to prevent voltages equal to or more than the terminal-to-terminal breakdown voltages from being applied between the terminals. The cascode transistor 601 is a gate grounded transistor connected in cascode to the source grounded transistor 102. FIG. 6 shows by way of example a configuration comprising two stages of cascodes (the gate grounded transistor 104 and the cascode transistor 601). However, it may be configured such that the number of cascode stages is increased if needed in response to the transistor terminal-to-terminal breakdown voltage or the power supply voltage.

Along with this, it becomes possible to control each terminal-to-terminal voltage of each gate grounded transistor to fall within the terminal-to-terminal breakdown voltage. Therefore, even if the power supply voltage is twice or more the lowest of the terminal-to-terminal breakdown voltages of the transistors, it is possible to form a low-noise amplifier with through-mode by use of only transistors whose terminal-to-terminal voltages are each equal to or less than the power supply voltage.

Embodiment 4

A fourth embodiment according to the present invention is an embodiment according to the first to third embodiments wherein MOSFETs 102, 104, 107, 202, 203, 207, 209, 210, 302, 303, 305, 309, 310, 404, 406, 408, 412 and 601 shown in FIGS. 1-6 are replaced with bipolar transistors 102B, 104B, 107B, 202B, 203B, 207B, 209B, 210B, 302B, 303B, 305B, 309B, 310B, 404B, 406B, 408B, 412B and 601B, respectively, as shown in FIGS. 9-14. The manner of such replacement has been widely known and its description is omitted accordingly.

Since the low-noise amplifier with through-modes of the present invention can be composed only of transistors whose terminal-to-terminal breakdown voltages are each equal to or less than the power supply voltage, this makes it possible to accomplish a reduction not only in production cost but also in lead time. Consequently, the present invention proves effective when embodied in low-noise amplifier with through-modes employed in communications equipment that requires reduction in price.

Numerous modifications and alternative embodiments of the present invention will be apparent to those skilled in the art in view of the foregoing description. Accordingly, this description is to be construed as illustrative only, and is provided for the purpose of teaching those skilled in the art the best mode of carrying out the present invention. The details of the structure and/or function may be varied substantially without departing from the spirit of the invention and all modifications which come within the scope of the appended claims are reserved.

REFERENCE SINGS LIST 1

1, 2 BIAS CIRCUIT
3, 4, 5, 6, 7, 8, 9 IMPEDANCE ELEMENT
50, 51 TRANSISTOR
60, 62 HIGH-FREQUENCY SWITCH
70 DC/DC CONVERTER
P10 INPUT TERMINAL
P11 EMITTER TERMINAL
P12 OUTPUT TERMINAL
P13, P14 VOLTAGE CONTROL TERMINAL
101, 401 INPUT TERMINAL
102 SOURCE GROUNDED TRANSISTOR
103, 204, 304, 411 OUTPUT TERMINAL
104, 305 GATE GROUNDED TRANSISTOR
105 BIAS CIRCUIT
106 LOAD IMPEDANCE ELEMENT
107, 207, 209, 210, 309, 310 SWITCHING TRANSISTOR
108 MODE CONTROL TERMINAL
109 LEVEL SHIFTER
110 THROUGH PASS CIRCUIT
201, 301 ELECTRIC CURRENT SUPPLY SOURCE
202, 302 PRIMARY SIDE TRANSISTOR
203, 303 SECONDARY SIDE TRANSISTOR
205, 307, 402, 405, 407, 409 RESISTOR
206, 208, 308, 403 CONTROL TERMINAL
211, 311 INVERTER
212, 306, 312 BIAS POWER SUPPLY SOURCE
404, 406, 408, 412 TRANSISTOR SWITCH
410 CAPACITOR
501 SOURCE IMPEDANCE ELEMENT
502 SWITCH PARALLEL IMPEDANCE ELEMENT
601 CASCODE TRANSISTOR
602 CASCODE BIAS CIRCUIT

What is claimed is:

1. A low-noise amplifier having an amplification mode in which input signals are amplified and a through mode in which input signals are let through, the low-noise amplifier comprising:
   a source grounded transistor connected at its gate to an input terminal;
   a gate grounded transistor connected in cascode to the source grounded transistor and connected at its drain to an output terminal;
   a bias circuit connected to a gate of the gate grounded transistor,
   a load impedance element connected to a drain of the gate grounded transistor;
   a switching transistor connected between the load impedance element and a power supply;
   a level shifter connected between a gate of the switching transistor and a mode control terminal to which a mode signal is inputted; and
   a through-pass circuit, connected between the input terminal and the output terminal, which, in response to the mode signal, turns off when the switching transistor turns on, and turns on when the switching transistor turns off,
   wherein at least one of a first breakdown voltage, a second breakdown voltage and a third breakdown voltage, which are a drain-to-gate breakdown voltage, a gate-to-source breakdown voltage and a drain-to-source breakdown voltage, of each of the source grounded transistor, the gate grounded transistor and the switching transistor, is equal to or less than a power supply voltage of the power supply.

2. The low-noise amplifier according to claim 1, wherein the level shifter is configured such that in the amplification mode, the level shifter outputs a voltage which is equal to or more than a differential between the power supply voltage and a lowest of the first, second and third breakdown voltages and equal to or less than a differential between the power supply voltage and a gate-to-source voltage that turns on the switching transistor, while in the through mode, the level shifter outputs a voltage that turns off the switching transistor, and wherein the level shifter is constituted by a transistor at least one of whose first, second and third breakdown voltages is equal to or less than the power supply voltage.

3. The low-noise amplifier according to claim 1, wherein the bias circuit is configured such that the bias circuit outputs a voltage which is equal to or more than a differential between the power supply voltage and a lowest of the first, second and third breakdown voltages and equal to or less than the lowest of the first, second and third breakdown voltages, and wherein the bias circuit is constituted by a transistor at least one of whose first, second and third breakdown voltages is equal to or less than the power supply voltage.

4. The low-noise amplifier according to claim 1, wherein the bias circuit is configured such that in the through mode, the bias circuit outputs a voltage which is equal to or less than a lowest of the first, second and third breakdown voltages, and wherein the bias circuit is constituted by a transistor at least one of whose first, second and third breakdown voltages is equal to or less than the power supply voltage.

5. The low-noise amplifier according to claim 1, wherein the load impedance element is a resonance circuit composed of an inductor and a capacitor, the inductor and the capacitor being connected in parallel with each other.

6. The low-noise amplifier according to claim 1, wherein a switch parallel impedance element is connected between the drain and the source of the switching transistor.

7. The low-noise amplifier according to claim 1, wherein the switch parallel impedance element is a resistor.

8. The low-noise amplifier according to claim 1, wherein a source impedance element is connected between the source of the source grounded transistor and ground.

9. The low-noise amplifier according to claim 1, wherein the source impedance element is an inductor.

10. The low-noise amplifier according to claim 1, wherein the through pass circuit comprises a transistor switch which outputs a signal, inputted to its drain or source, through its source or drain and which is turned off in the amplification mode and turned on in the through mode by the mode signal to be inputted at its gate.

11. The low-noise amplifier according to claim 1, wherein the through-pass circuit comprises a serial connection of plural stages of the transistor switches.

12. The low-noise amplifier according to claim 1, further comprising:
   a cascode transistor composed of one or more gate grounded transistors connected in cascode between the source grounded transistor and the gate grounded transistor; and
   a cascode bias circuit connected to the gate of each the cascode transistor.

13. A low-noise amplifier having an amplification mode in which input signals are amplified and a through mode in which input signals are let through, the low-noise amplifier comprising:
   an emitter grounded transistor connected at its base to an input terminal;

a base grounded transistor connected in cascode to the emitter grounded transistor and connected at its collector to an output terminal;
a bias circuit connected to a base of the base grounded transistor;
a load impedance element connected to a collector of the base grounded transistor;
a switching transistor connected between the load impedance element and a power supply;
a level shifter connected between a base of the switching transistor and a mode control terminal to which a mode signal is inputted; and
a through pass circuit, connected between the input terminal and the output terminal, which, in response to the mode signal, turns off when the switching transistor turns on, and turns on when the switching transistor turns off,
wherein at least one of a first breakdown voltage, a second breakdown voltage, and a third breakdown voltage, which are a collector-to-base breakdown voltage, a base-to-emitter breakdown voltage and a collector-to-emitter breakdown voltage, of each of the emitter grounded transistor, the base grounded transistor, and the switching transistor, is equal to or less than a power supply voltage of the power supply.

14. The low-noise amplifier according to claim 13, wherein the level shifter is configured such that in the amplification mode the level shifter outputs a voltage which is equal to or more than a differential between the power supply voltage and a lowest of the first, second and third breakdown voltages and equal to or less than a differential between the power supply voltage and a base-to-emitter voltage that turns on the switching transistor while in the through mode the level shifter outputs a voltage that turns off the switching transistor, and wherein the level shifter is constituted by a transistor at least one of whose first, second and third breakdown voltages is equal to or less than the power supply voltage.

15. The low-noise amplifier according to claim 13, wherein the bias circuit is configured such that the bias circuit outputs a voltage which is equal to or more than a differential between the power supply voltage and a lowest of the first, second and third breakdown voltages and equal to or less than the lowest of the first, second and third breakdown voltages, and wherein the bias circuit is constituted by a transistor at least one of whose first, second and third breakdown voltages is equal to or less than the power supply voltage.

16. The low-noise amplifier according to claim 13, wherein the bias circuit is configured such that in the through mode the bias circuit outputs a voltage which is equal to or less than a lowest of the first, second and third breakdown voltages, and wherein the bias circuit is constituted by a transistor at least one of whose first, second and third breakdown voltages is equal to or less than the power supply voltage.

17. The low-noise amplifier according to claim 13, wherein the load impedance element is a resonance circuit composed of an inductor and a capacitor, the inductor and the capacitor being connected in parallel with each other.

18. The low-noise amplifier according to claim 13, wherein a switch parallel impedance element is connected between the collector and the emitter of the switching transistor.

19. The low-noise amplifier according to claim 13, wherein the switch parallel impedance element is a resistor.

20. The low-noise amplifier according to claim 13, wherein an emitter impedance element is connected between the emitter of the emitter grounded transistor and ground.

21. The low-noise amplifier according to claim 13, wherein the emitter impedance element is an inductor.

22. The low-noise amplifier according to claim 13, wherein the through pass circuit comprises a transistor switch which outputs a signal, inputted to its collector or emitter, through its emitter or collector and which is turned off in the amplification mode and turned on in the through mode by the mode signal to be inputted at its base.

23. The low-noise amplifier according to claim 13, wherein the through pass circuit comprises a serial connection of plural stages of the transistor switches.

24. The low-noise amplifier according to claim 13, further comprising:
a cascode transistor composed of one or more base grounded transistors connected in cascode between the emitter grounded transistor and the base grounded transistor; and
a cascode bias circuit connected to the base of each the cascode transistor.

* * * * *